US 12,204,265 B2

(12) United States Patent
Hirano et al.

(10) Patent No.: US 12,204,265 B2
(45) Date of Patent: Jan. 21, 2025

(54) TECHNIQUE FOR ATTACHING OPTICAL SENSOR TO IMAGE FORMING APPARATUS

(71) Applicant: CANON KABUSHIKI KAISHA, Tokyo (JP)

(72) Inventors: Masayuki Hirano, Chiba (JP); Masaaki Moriya, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/376,507

(22) Filed: Oct. 4, 2023

(65) Prior Publication Data
US 2024/0027945 A1 Jan. 25, 2024

Related U.S. Application Data

(63) Continuation of application No. 17/221,002, filed on Apr. 2, 2021, now Pat. No. 11,809,115.

(30) Foreign Application Priority Data

Apr. 9, 2020 (JP) .................. 2020-070564
Apr. 9, 2020 (JP) .................. 2020-070565

(51) Int. Cl.
G03G 15/00 (2006.01)
H01L 25/16 (2023.01)
(52) U.S. Cl.
CPC ....... G03G 15/5033 (2013.01); H01L 25/165 (2013.01); H01L 25/167 (2013.01)
(58) Field of Classification Search
CPC ........... G03G 15/0855; G03G 15/0862; G03G 15/5033
See application file for complete search history.

(56) References Cited

U.S. PATENT DOCUMENTS 5,148,218 A 9/1992 Nakane et al.
5,640,316 A 6/1997 Moriya
(Continued)

FOREIGN PATENT DOCUMENTS

JP S61-027293 U 2/1986
JP H04-063367 A 2/1992
(Continued)

OTHER PUBLICATIONS

Machine translation of JP 2006208266 (Year: 2006).*
(Continued)

Primary Examiner — Walter L Lindsay, Jr.
Assistant Examiner — Andrew V Do
(74) Attorney, Agent, or Firm — Venable LLP

(57) ABSTRACT

An image forming apparatus includes an optical sensor configured to measure reflected light from a test image on the image carrier. The optical sensor includes a printed circuit board, with a light-emitting element provided on a first surface of the printed circuit board, and with the light-emitting element being configured to irradiate the test image on the image carrier with light. The optical sensor also includes a light-receiving element provided on the first surface of the printed circuit board, with the light-receiving element being configured to receive the reflected light from the test image on the image carrier. A connector is provided on a second surface of the printed circuit board opposite to the first surface of the printed circuit board, with a cable for controlling the optical sensor being connected to the connector. A support member is configured to support the optical sensor so that the first surface of the printed circuit board faces a surface of the image carrier, and a controller is configured to control the image forming unit based on a result of the reflected light from the test image measured by the optical sensor. A direction in which the cable is inserted (Continued)

into the connector is orthogonal to the second surface of the printed circuit board.

4 Claims, 13 Drawing Sheets

(56) References Cited

U.S. PATENT DOCUMENTS

| | | |
|---|---|---|
| 2012/0189326 A1 | 7/2012 | Yoshida et al. |
| 2019/0291993 A1 | 9/2019 | Shiba |

FOREIGN PATENT DOCUMENTS

| | | |
|---|---|---|
| JP | H06-003998 A | 1/1994 |
| JP | H06-291476 A | 10/1994 |
| JP | 2003-091108 A | 3/2003 |
| JP | 2006-208266 A | 8/2006 |
| JP | 2009-260476 A | 11/2009 |
| JP | 2011-107307 A | 6/2011 |
| JP | 2012-163927 A | 8/2012 |
| JP | 2020-027197 A | 2/2020 |

OTHER PUBLICATIONS

Jan. 9, 2024 Office Action in Japanese Patent Application No. 2020-070564.
Jan. 9, 2024 Office Action in Japanese Patent Application No. 2020-070565.

* cited by examiner

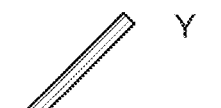
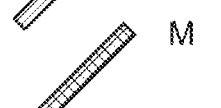
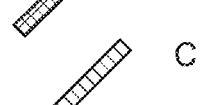
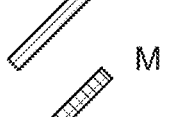
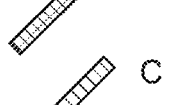
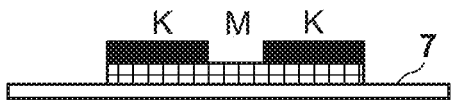
FIG. 9A    FIG. 9B    FIG. 9C F I G. 12A
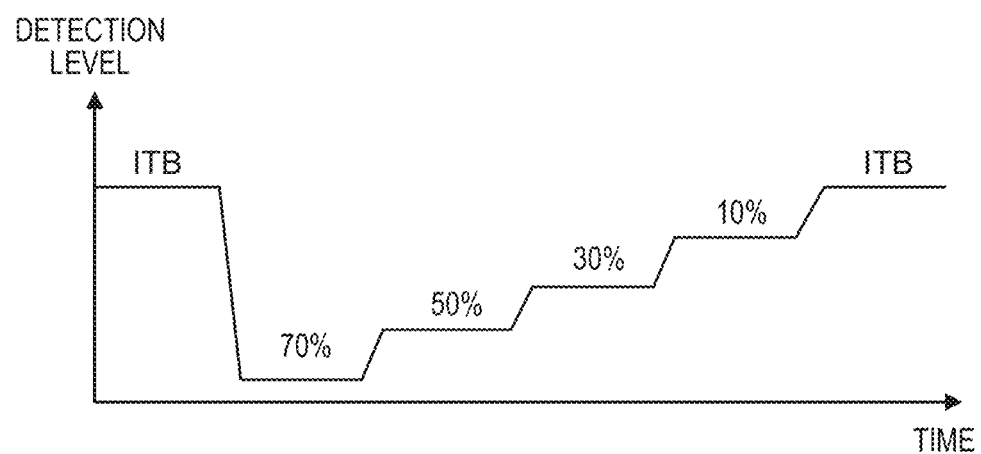
F I G. 12B
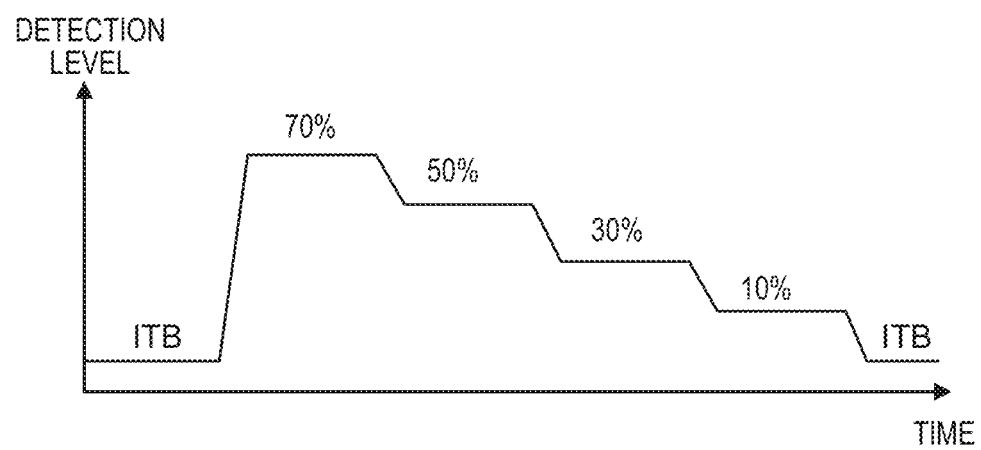

TECHNIQUE FOR ATTACHING OPTICAL SENSOR TO IMAGE FORMING APPARATUS

BACKGROUND OF THE INVENTION

Field of the Invention

The present invention relates to a technique for attaching an optical sensor to an image forming apparatus.

Description of the Related Art

In a color image forming apparatus that forms images using toner, an optical sensor is used to correct the formation position of a toner image and the density (tone properties) of the toner image. The image forming apparatus measures a test pattern using the optical sensor, and corrects the formation position of the toner image and the density of the toner image on the basis of a result of the measurement. Japanese Patent Laid-Open No. 2006-208266 discloses a measurement apparatus that measures an amount of adhering toner.

There is demand in the market for toner pattern sensors, which sense toner images, to be miniaturized as well. However, many electronic components, such as light-emitting elements, light-receiving elements, control ICs, and connectors, are mounted on the printed circuit board of a toner pattern sensor, and it is therefore not easy to miniaturize the toner pattern sensor. Toner pattern sensors are fixed to a supporting member such as a frame of the image forming apparatus, and there is a need to ensure that the electronic components of the toner pattern sensor and the supporting member do not interfere with each other.

SUMMARY OF THE INVENTION

The present invention provides an image forming apparatus comprising the following elements. An image carrier. An image forming unit is configured to form an image on the image carrier. A transfer unit is configured to transfer the image from the image carrier into a sheet. An optical sensor is configured to measure reflected light from the image on the image carrier. The optical sensor includes a printed circuit board having a first mounting surface and a second mounting surface, a light-emitting element mounted on the first mounting surface of the printed circuit board, a light-receiving element mounted on the first mounting surface of the printed circuit board, and an electronic component mounted on the second mounting surface of the printed circuit board. The electronic component is used for driving the light-emitting element. A supporting member is configured to support the printed circuit board. The supporting member has a through-hole in which the electronic component on the second mounting surface is inserted when the printed circuit board is supported by the supporting member. A controller is configured to control the image forming unit based on a measurement result of the optical sensor.

Further features of the present invention will become apparent from the following description of exemplary embodiments (with reference to the attached drawings).

BRIEF DESCRIPTION OF THE DRAWINGS

FIGS. 9A to 9C are diagrams illustrating a toner pattern.

FIGS. 12A and 12B are diagrams illustrating a result of detecting a toner pattern.

DESCRIPTION OF THE EMBODIMENTS

Figure 1A:
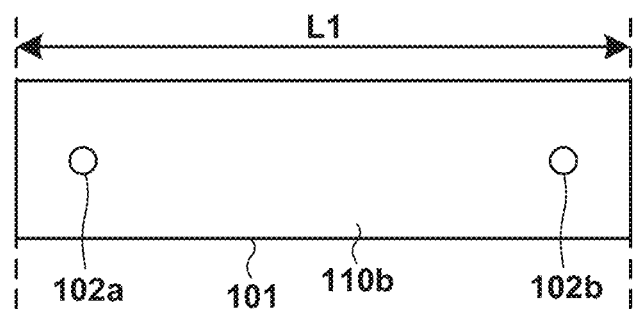
FIGS. 1A to 1C are diagrams illustrating a toner pattern sensor.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate.

Furthermore, in the attached drawings, the same reference numerals are given to the same or similar configurations, and redundant description thereof is omitted.

Mounting of Optical Sensor

Single-Sided Mounting

FIG. 1A is a plan view illustrating a second surface 110b of a printed circuit board 101 on which an optical sensor is mounted. A length of the printed circuit board 101 in the longer direction is L1. Two screw holes 102a and 102b, into which screws are inserted, are provided in the printed circuit board 101.

Figure 1B:
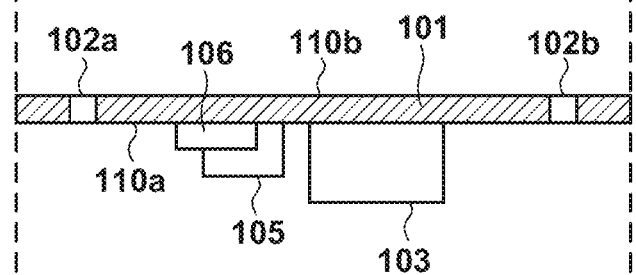
Figure 1C:
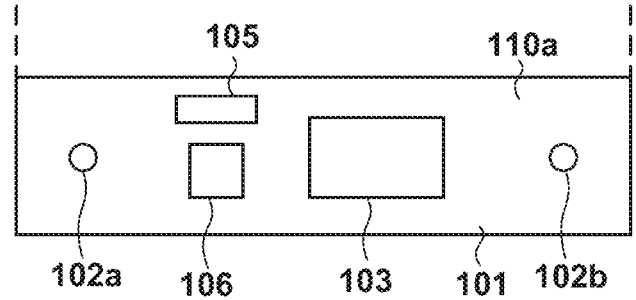

FIG. 1B is a cross-sectional view of the printed circuit board 101 on which the optical sensor is mounted. FIG. 1C is a plan view illustrating a first surface 110a of the printed circuit board 101 on which the optical sensor is mounted. A connector 105, a mounted component 106, and an optical case 103 are mounted on the first surface 110a of the printed circuit board 101. A cable including a power line, a ground line, a control signal line, and a data signal line is connected to the connector 105. A light-emitting element and a light-receiving element, which constitute the optical sensor, are contained within the optical case 103. The mounted component 106 includes a control IC and the like that control the optical sensor. In this manner, the connector 105, the mounted component 106, and the optical case 103 are mounted on one surface of the printed circuit board 101. This has the advantage of making it possible to bring the second surface 110b of the printed circuit board 101 into close contact with a frame member of an image forming apparatus. In other words, the frame member can stably hold the printed circuit board 101.

Double-Sided Mounting

Figure 2A:
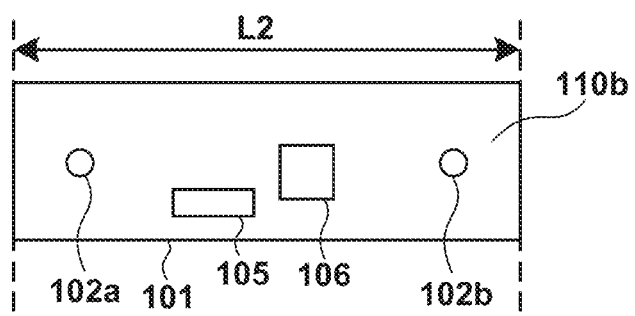
FIGS. 2A to 2C are diagrams illustrating a toner pattern sensor.
Figure 2B:
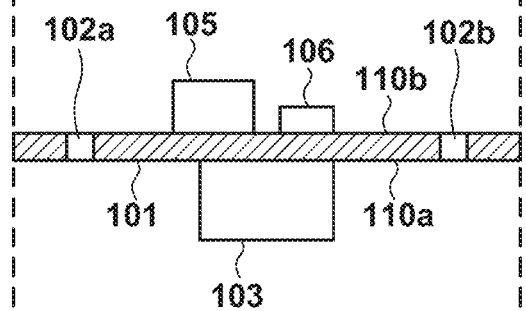
Figure 2C:
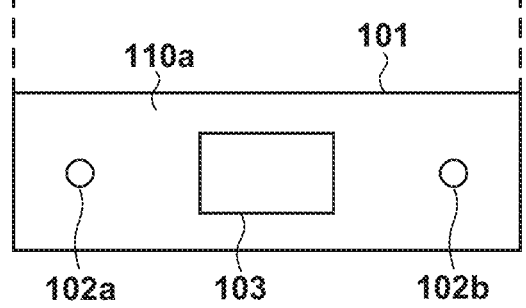

FIG. 2A is a plan view illustrating the second surface 110b of the printed circuit board 101 on which the optical sensor is mounted. FIG. 2B is a cross-sectional view of the printed circuit board 101 on which the optical sensor is mounted. FIG. 2C is a plan view illustrating the first surface 110a of the printed circuit board 101 on which the optical sensor is mounted. Note that in the following descriptions, elements which have already been described will be given like reference signs, and the previous descriptions are assumed to apply thereto as well.

In this example, the connector 105 and the mounted component 106 are mounted on the second surface 110b, and the optical case 103 is mounted on the first surface 110a. By distributing the components on both surfaces of the printed circuit board 101 in this manner, a length L2 of the printed circuit board 101 in the longer direction can be shortened (L2<L1). Thus, double-sided mounting is effective in reducing the size of the sensor.

Attachment to Frame Member

Figure 3A:
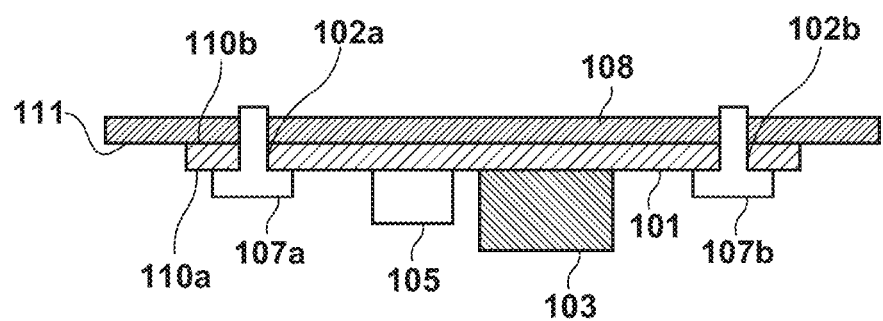
FIGS. 3A and 3B are diagrams illustrating a toner pattern sensor.

FIG. 3A illustrates a frame member 108 attached to the printed circuit board 101 that uses single-sided mounting. A screw 107a is inserted into the screw hole 102a from the first surface 110a toward the second surface 110b and is screwed into the frame member 108. A screw 107b is also inserted into the screw hole 102b from the first surface 110a toward the second surface 110b and is screwed into the frame member 108. In this example, the second surface 110b of the printed circuit board 101 opposes and is in close contact with an attachment surface 111 of the frame member 108. This makes it possible for the frame member 108 to stably hold the printed circuit board 101.

Figure 3B:
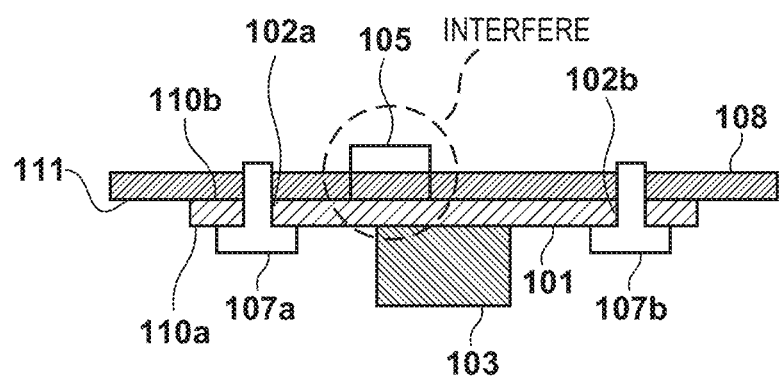

FIG. 3B illustrates a frame member 108 attached to the printed circuit board 101 that uses double-sided mounting. In this case, the connector 105 is provided on the second surface 110b of the printed circuit board 101, which opposes the attachment surface 111 of the frame member 108. If the attachment surface 111 of the frame member 108 is flat, the connector 105 will interfere with the attachment surface 111 of the frame member 108. In this case, clearance for the connector 105 may be secured between the attachment surface 111 of the frame member 108 and the second surface 110b of the printed circuit board 101. To secure this clearance, a cylindrical spacer may be provided at each of the positions of the screw holes 102a and 102b. Securing such clearance can reduce the closeness of the contact between the attachment surface 111 of the frame member 108 and the second surface 110b of the printed circuit board 101. Additionally, the direction in which the cable is inserted into the connector 105 is parallel to the second surface 110b.

Interference Reduction Measures

Figure 4A:
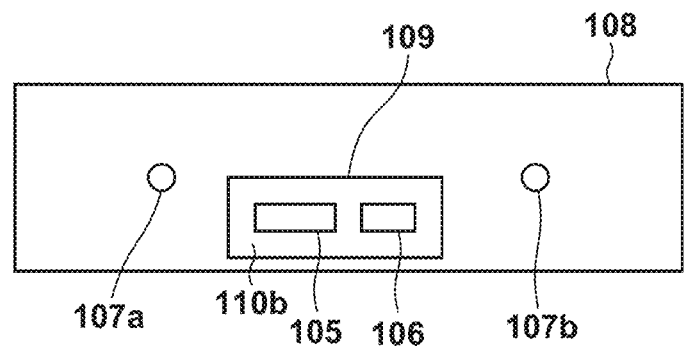
FIGS. 4A to 4C are diagrams illustrating a toner pattern sensor.
Figure 4B:
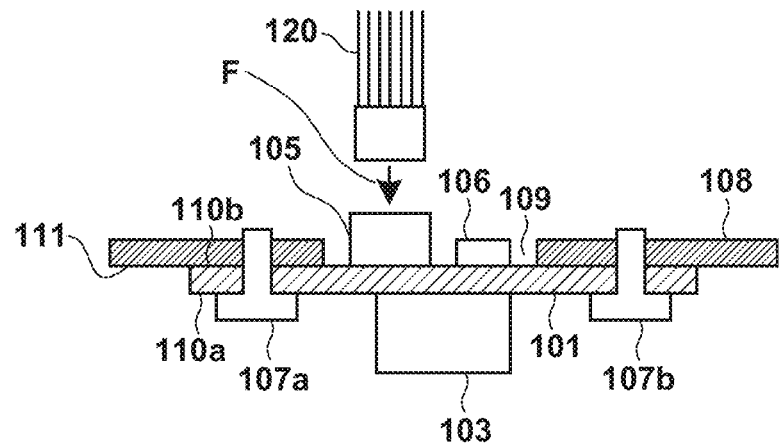
Figure 4C:
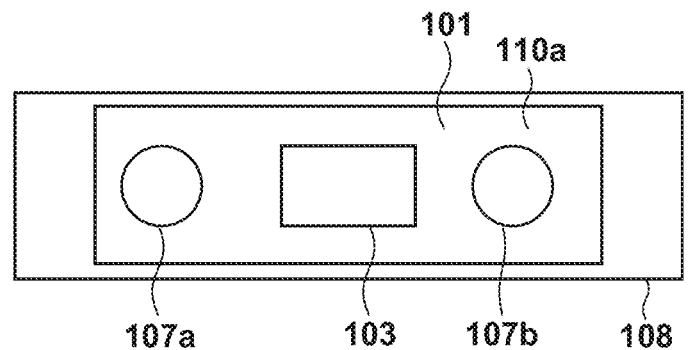

FIG. 4A is a plan view illustrating the second surface 110b of the printed circuit board 101 that employs double-sided mounting and interference reduction measures. FIG. 4B is a cross-sectional view of the printed circuit board 101 that employs double-sided mounting and interference reduction measures. FIG. 4C is a plan view illustrating the first surface 110a of the printed circuit board 101 that employs double-sided mounting and interference reduction measures. Particularly, the frame member 108 has a through-hole 109 for avoiding interference with electronic components (the connector 105 and the mounted component 106). The through-hole 109 has an open plane in which the connector 105 and the mounted component 106 can be accommodated or inserted. In other words, the opening area of the through-hole 109 is greater than a horizontal cross-sectional area of the connector 105 and the mounted component 106 mounted to the second surface 110b. In the present embodiment, "horizontal" refers to a plane parallel to the printed circuit board 101. The second surface 110b of the printed circuit board 101 and the attachment surface 111 of the frame member 108 can be put into close contact with each other. This makes it possible for the frame member 108 to stably hold the printed circuit board 101. Employing double-sided mounting for the electronic components makes it possible to reduce the size of the optical sensor, and employing interference reduction measures makes it less likely that the electronic components and the frame member 108 will interfere with each other. Note that a cable 120 is inserted into the connector 105 in a direction from the second surface 110b to the first surface 110a of the printed circuit board 101. This direction is indicated by an arrow F. A plug that fits with the connector 105 is provided at a tip of the cable 120.

Variation on Through-Hole

In FIG. 4C, the length of the through-hole 109 in the shorter direction is shorter than the length of the printed circuit board 101 in the shorter direction. The length of the through-hole 109 in the longer direction is also shorter than the length of the printed circuit board 101 in the longer direction. However, this is merely one example. It is sufficient for the length of the through-hole 109 in the shorter direction to be shorter than the length of the printed circuit board 101 in the shorter direction, or for the length of the through-hole 109 in the longer direction to be shorter than the length of the printed circuit board 101 in the longer direction.

Figure 5A:
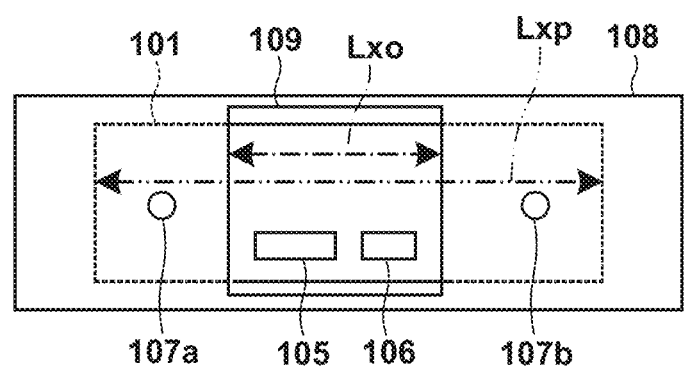
FIGS. 5A and 5B are diagrams illustrating a toner pattern sensor.

FIG. 5A illustrates a variation on the through-hole 109. In this example, the length of the through-hole 109 in the shorter direction is longer than the length of the printed circuit board 101 in the shorter direction. However, a length Lxo of the through-hole 109 in the longer direction is shorter than a length Lxp of the printed circuit board 101 in the longer direction.

Figure 5B:
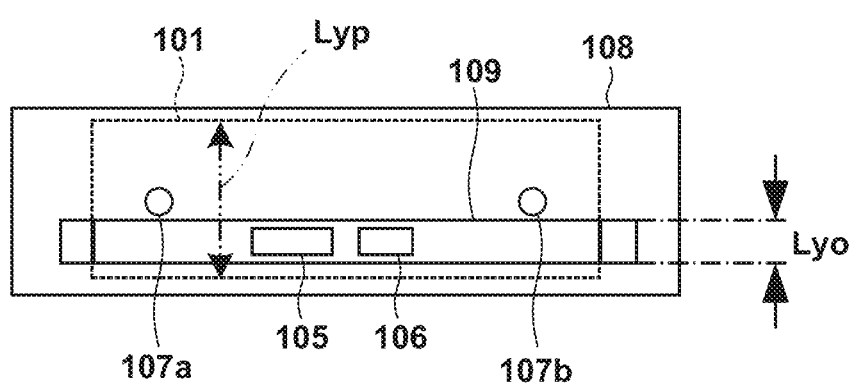

FIG. 5B illustrates another variation on the through-hole 109. In this example, a length Lyo of the through-hole 109 in the shorter direction is shorter than a length Lyp of the printed circuit board 101 in the shorter direction. However, the length of the through-hole 109 in the longer direction is longer than the length of the printed circuit board 101 in the longer direction.

Image Forming Apparatus

Figure 6:
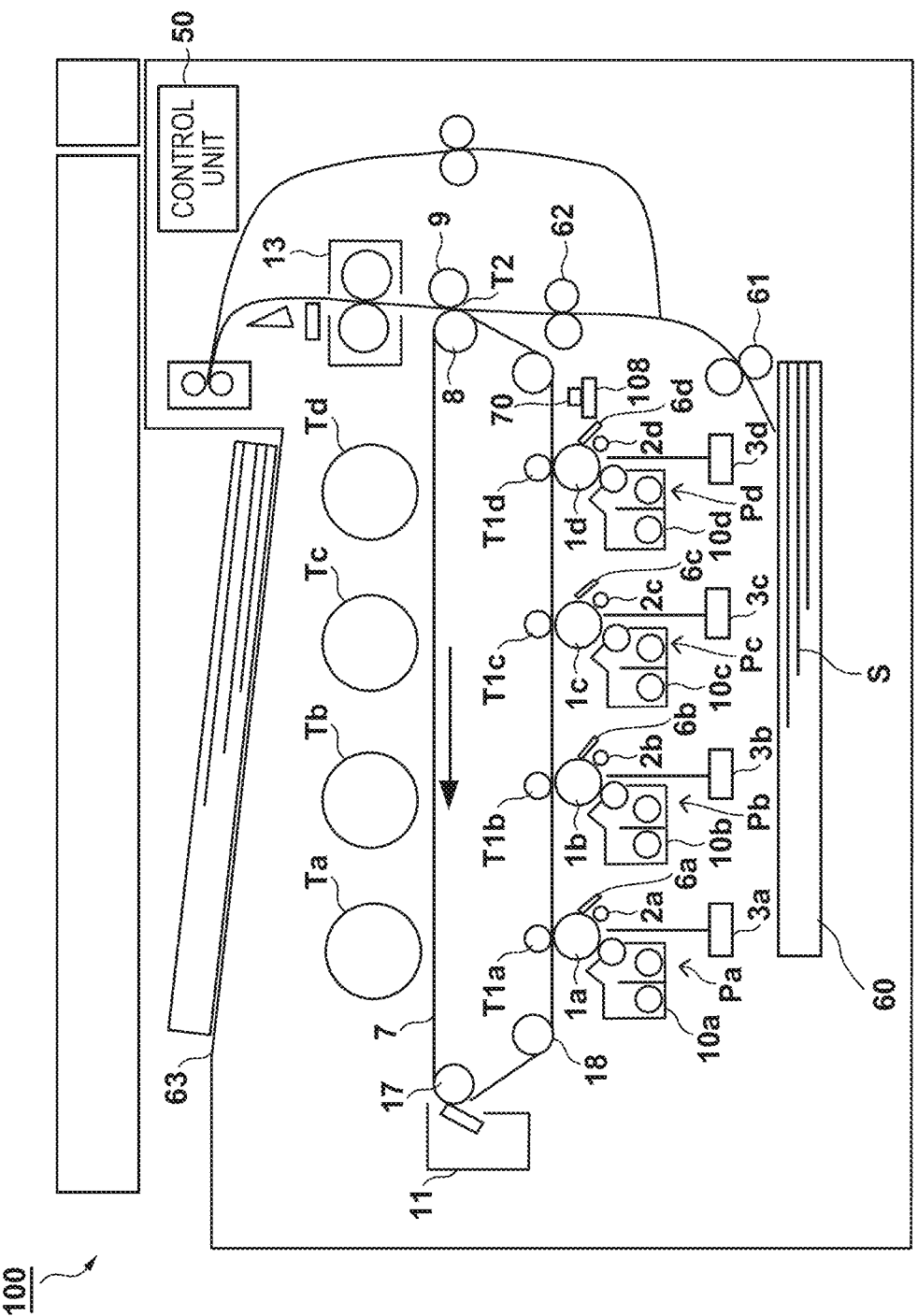
FIG. 6 is a diagram illustrating an image forming apparatus.

As illustrated in FIG. 6, an image forming apparatus 100 is a printer, a copier, a multifunction peripheral, a facsimile machine, or the like that forms color images using the electrophotographic method. Four image forming units Pa to Pd are controlled by a control unit 50, and each forms an image on an intermediate transfer belt 7 using a different color of toner. The lowercase letters a, b, c, and d at the end of the reference signs yellow, magenta, cyan, and black, respectively. The lowercase letters a, b, c, and d may be omitted when describing items common to the four colors.

A holding tray 60 holds a large number of sheets S. A paper feed roller 61 feeds the sheets S one by one from the holding tray 60 into a transport path. A resist roller 62 corrects skew in the sheet S and transports the sheet S to a secondary transfer unit T2.

Each image forming unit P includes a photosensitive member 1, a charger 2, an exposure device 3, a developer 10, a primary transfer unit T1, and a photosensitive member cleaner 6. The charger 2 uniformly charges the surface of the photosensitive member 1. The photosensitive member 1 is rotationally driven by a motor or the like. The exposure device 3 irradiates the surface of the photosensitive member 1 with light and forms an electrostatic latent image thereon. The developer 10 develops the electrostatic latent image carried on the photosensitive member 1 using toner, and forms a toner image. The primary transfer unit T1 transfers the toner image carried on the photosensitive member 1 to the intermediate transfer belt 7. The yellow, magenta, cyan, and black toner images are transferred onto the intermediate transfer belt 7 in a superimposed manner. A full-color image is formed as a result. The photosensitive member cleaner 6 cleans and collects toner remaining on the photosensitive member 1. When the amount of toner held inside the developers 10a to 10d drops below a predetermined amount, toner is replenished from toner bottles Ta to Td, which are developing agent replenishment receptacles.

The intermediate transfer belt 7 is an endless belt stretched by an inner roller 8, a tension roller 17, and an upstream roller 18. The intermediate transfer belt 7 is driven by the inner roller 8, the tension roller 17, and the upstream roller 18, and rotates in the direction indicated by the arrow. When the intermediate transfer belt 7 rotates, the toner image is transported to the secondary transfer unit T2.

The secondary transfer unit T2 is a transfer nip unit formed by the inner roller 8 and an outer roller 9 disposed facing each other. The inner roller 8 and outer roller 9 may be called "secondary transfer rollers". The secondary transfer unit T2 transfers the toner image from the intermediate transfer belt 7 to the sheet S. A belt cleaner 11 cleans and collects toner remaining on the intermediate transfer belt 7.

A fixer 13 applies pressure and heat to the toner image and sheet S to melt and fix the toner image onto the sheet S. The fixer 13 discharges the sheet S onto a paper discharge tray 63.

A toner pattern sensor 70 is provided near the intermediate transfer belt 7, and detects a toner pattern for color shift detection and a toner pattern for density detection. The structure of the toner pattern sensor 70 is illustrated in FIGS. 5A to 5C. The toner pattern sensor 70 is fixed to the frame member 108. In FIG. 6, the toner pattern sensor 70 is disposed between the photosensitive member 1d and the outer roller 9. This position is a position where the yellow, magenta, cyan, and black toner images can be detected.

Toner Pattern Sensor

Figure 7:
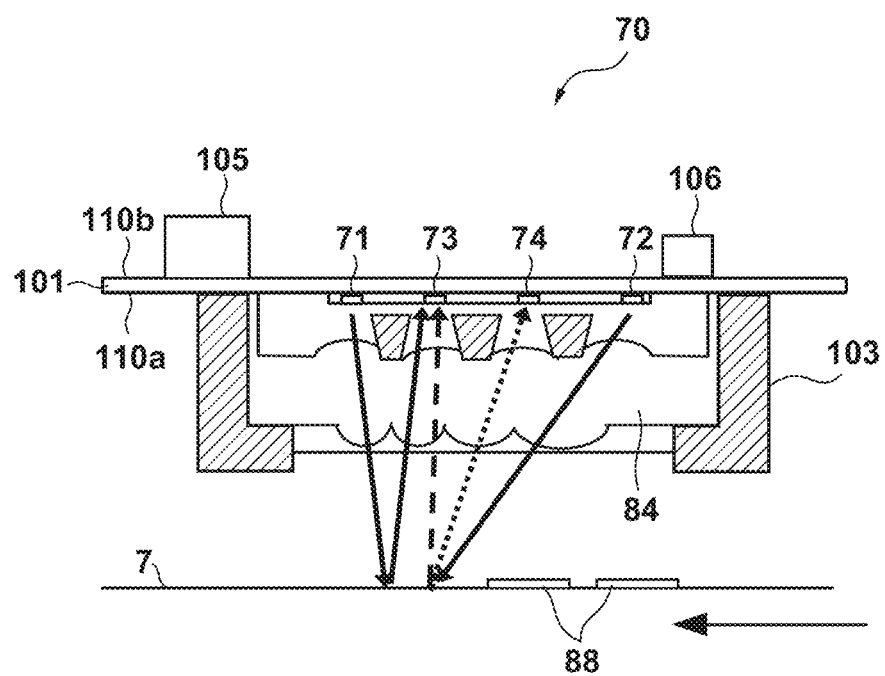
FIG. 7 is a diagram illustrating a toner pattern sensor.

FIG. 7 illustrates the toner pattern sensor 70. The toner pattern sensor 70 detects a toner pattern 88 formed on the intermediate transfer belt 7 and a base material of the intermediate transfer belt 7. The toner pattern sensor 70 has two light-emitting elements and two light-receiving elements. LEDs 71 and 72 are, for example, light-emitting diodes that emit infrared light. PDs 73 and 74 are, for example, photodiodes that receive infrared light. An integrated molded lens 84 is configured so that the light from the LED 71 forms a suitable spot on the intermediate transfer belt 7. The molded lens 84 is configured so that the light from the LED 72 forms a suitable spot on the intermediate transfer belt 7. Furthermore, the molded lens 84 is configured so that reflected light from the base material of the intermediate transfer belt 7 or the toner pattern 88 forms an image on the PD 73. The molded lens 84 is configured so that reflected light from the toner pattern 88 forms an image on the PD 74.

LEDs 71 and 72 and the PDs 73 and 74 are mounted on the printed circuit board 101 along with a drive circuit. The optical case 103 is a housing that houses these components.

The LED 71 is positioned so that the infrared light from the LED 71 is incident on the intermediate transfer belt 7 at an incident angle of 10°. The PD 73 is positioned so that regularly-reflected light which, of the light with which the intermediate transfer belt 7 and the toner pattern 88 have been irradiated, has a reflection angle of −10°, is incident on the PD 73. The LED 72 is positioned so that the infrared light from the LED 72 is incident on the intermediate transfer belt 7 at an incident angle of −35°. The PD 73 is positioned so as to be capable of receiving regularly-reflected light which, of the light with which the LED 72 has irradiated the intermediate transfer belt 7 and the toner pattern 88, has a reflection angle of −7°. Therefore, the PD 73 receives the regularly-reflected light, of the light emitted from the LED 71, reflected by the intermediate transfer belt 7 and toner pattern 88, and the diffuse light, of the light emitted by the LED 72, reflected by the intermediate transfer belt 7 and toner pattern 88. The control unit 50 turns on the LED 71 and turns off the LED 72 to cause the PD 73 to detect the regularly-reflected light. The control unit 50 turns off the LED 71 and turns on the LED 72 to cause the PD 73 to detect the diffuse light. The PD 74 receives the diffuse light, output from the LED 72, which of the light reflected by the intermediate transfer belt 7 and toner pattern 88 has a reflection angle of −18°. However, these angles are merely examples.

Control Unit

Figure 8:
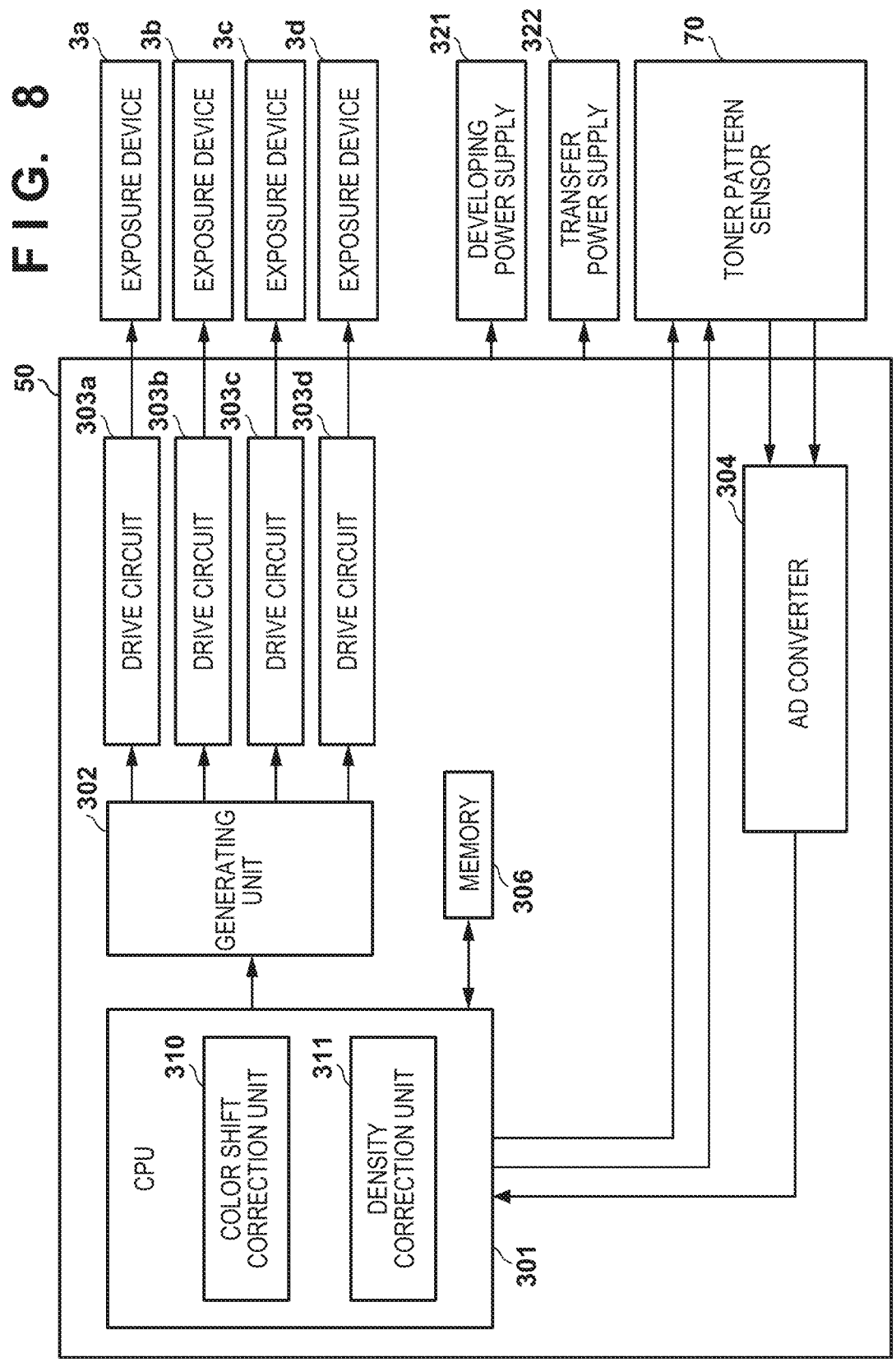
FIG. 8 is a diagram illustrating a control unit.

FIG. 8 illustrates the control unit 50 and the toner pattern sensor 70. A CPU 301 drives the motor and the like on the basis of signals input from sensors, and causes the image forming apparatus 100 to execute an electrophotographic process. Memory 306 is connected to the CPU 301. A control program is stored in a ROM area of the memory 306. Temporary data is stored in a RAM area of memory 306.

A generating unit 302 converts image data from a user into an image signal and outputs the image signal to a drive circuit 303. The drive circuit 303 drives the exposure device 3 according to the image signal. The generating unit 302 also generates an image signal for forming a test pattern.

A color shift correction unit 310 forms a test pattern for color shift correction on the intermediate transfer belt 7, and causes the toner pattern sensor to detect the test pattern. A detection result is input to the color shift correction unit 310 via an AD converter 304. The color shift correction unit 310 finds an amount of shift of another color relative to a reference color on the basis of the detection result, and determines a correction amount for a writing position of the other color. The CPU 301 corrects the writing position of the other color according to this correction amount.

A density correction unit 311 forms a test pattern for density correction on the intermediate transfer belt 7, and causes the toner pattern sensor 70 to detect the test pattern. A detection result is input to the density correction unit 311 via the AD converter 304. The density correction unit 311 corrects a developing voltage or a transfer voltage so that tone properties of the toner image take on target tone properties. A developing power supply 321 supplies the developing voltage corrected by the density correction unit 311 to the developer 10. A transfer power supply 322 supplies the transfer voltage corrected by the density correction unit 311 to the primary transfer unit T1.

Color Shift Detection

FIG. 9A illustrates a first pattern 601 for color shift detection. "Color shift" refers to an amount of shift in an image formation position of a given color relative to the image formation position of the reference color. The reference color is yellow, for example. The first pattern 601 includes a yellow "Y" pattern, a magenta "M" pattern, a cyan "C" pattern, and a black "K" pattern. The first pattern 601 is a test pattern that is detected by turning on the LED 71, turning off the LED 72, and receiving the regularly-reflected light with the PD 73. The first pattern 601 is used when a detection level of regularly-reflected light from the base material of the intermediate transfer belt 7 is above a threshold th1.

Figure 10A:
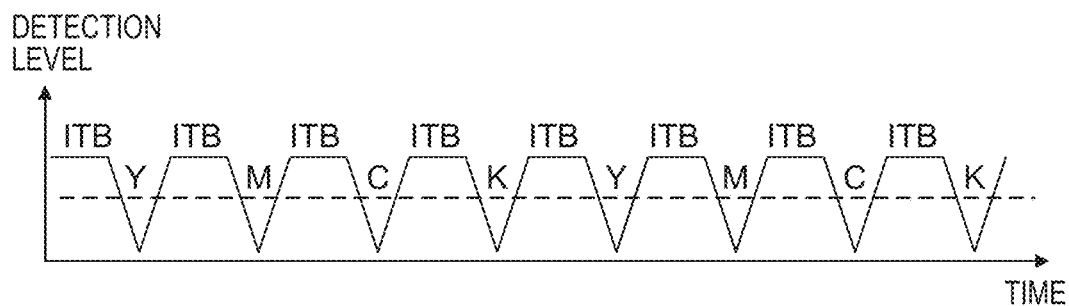
FIGS. 10A to 10C are diagrams illustrating a result of detecting a toner pattern.

FIG. 10A illustrates a detection result for the first pattern 601. The broken line represents a light amount at which edge detection is executed. In FIG. 10A, "ITB" refers to the base material of the intermediate transfer belt 7. When the reflectance of the surface of the intermediate transfer belt 7 is sufficiently high, there will be more regularly-reflected light from the intermediate transfer belt 7. Therefore, there is a significant difference between the detection level of the base material of the intermediate transfer belt 7 and the detection level of each of the YMCK patterns. This makes it possible to detect the position of the rising edge of each YMCK pattern, and find the amount of color shift. Because two edges are detected for each pattern, a location between the two edges is found as the center of the pattern (image formation position).

FIG. 9B illustrates a second pattern 602 for color shift detection. The second pattern 602 is a test pattern that is detected by turning off the LED 71, turning on the LED 72, and receiving the diffuse light with the PD 73. The second pattern 602 is used when the detection level of reflected light from the intermediate transfer belt 7 is less than the threshold th1.

Figure 10B:
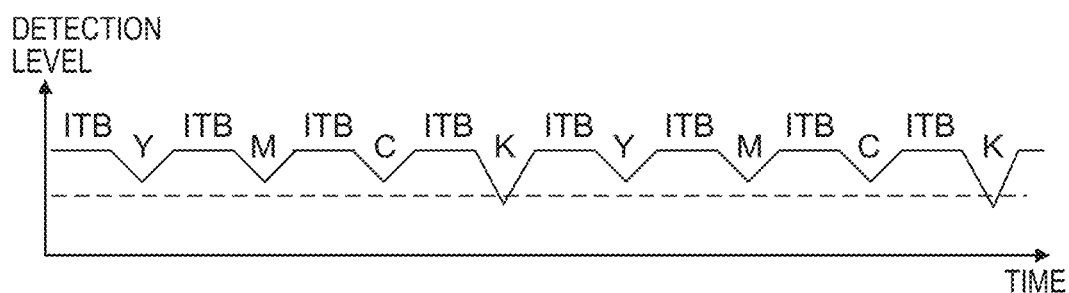

When the intermediate transfer belt 7 is used for many years, the reflectance of the surface of the intermediate transfer belt 7 drops from an initial value (the reflectivity when new). The amount of regularly-reflected light from the intermediate transfer belt 7 drops as a result. FIG. 10B illustrates a detection result of the first pattern 601 when the amount of regularly-reflected light from the intermediate transfer belt 7 has dropped. As illustrated in FIG. 10B, a difference between the detection level of the base material of the intermediate transfer belt 7 and the detection level of the yellow "Y", magenta "M", cyan "C", and black "K" patterns decreases. In this case, it is difficult to detect the edges of yellow "Y", magenta "M", cyan "C", and black "K" patterns.

Figure 10C:
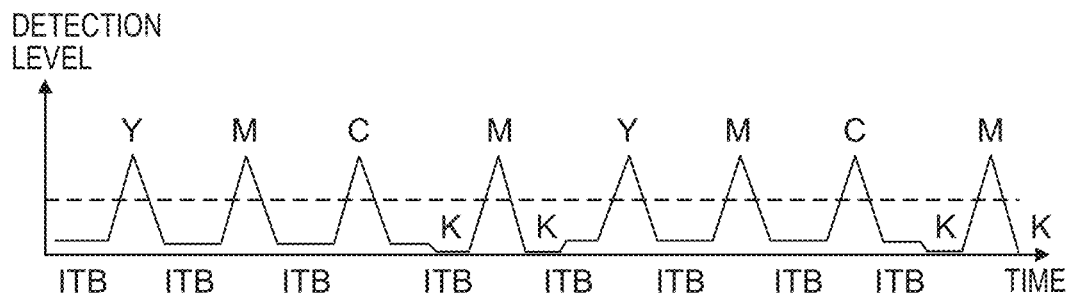

The diffuse light is therefore detected. In the diffuse light detection, the LED 71 is turned off and the LED 72 is turned on. Furthermore, the PD 73 receives the diffuse light. The second pattern 602 is used. FIG. 10C illustrates a detection result for the second pattern 602. The chromatic color patterns all cross the broken line for edge detection, and thus edge detection is possible. Note that in the diffuse light detection, the difference between the detection level of the base material of the intermediate transfer belt 7 and the detection level of the black test pattern is too low. Thus as illustrated in FIGS. 9B and 9C, the black pattern is formed on both sides of the magenta test pattern. As illustrated in FIG. 10C, there is a significant difference between the magenta detection level and the black detection level. As such, detecting the edges for magenta effectively makes it possible to detect the edges of black as well.

The second pattern 602 uses a greater amount of magenta and black toner than the first pattern 601. In other words, prioritizing the use of the first pattern 601 reduces the amount of magenta and black toner that is consumed.

In this manner, the CPU 301 detects the amount of color shift of other colors relative to the reference color using the first pattern 601 or the second pattern 602. The CPU 301 also adjusts the writing timing of the images of other colors relative to the reference color in accordance with the amount of color shift. This reduces color shifts.

Density Detection

Figure 11A:
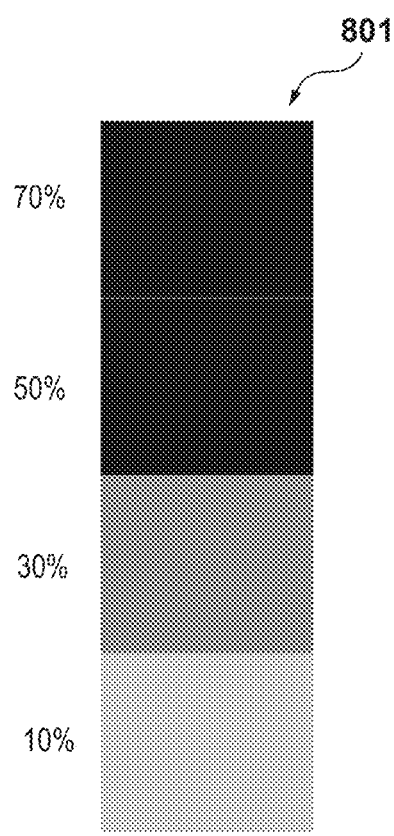
FIGS. 11A and 11B are diagrams illustrating a toner pattern.

FIG. 11A illustrates a first density pattern 801 for detecting the density of a toner image. The first density pattern 801 is a test pattern for turning on the LED 71, turning off the LED 72, and receiving the regularly-reflected light with the PD 73. The first density pattern 801 is a test pattern for black. Black has the property of absorbing light. It is therefore difficult to detect the black pattern with diffuse light. As such, the first density pattern 801 for black is detected using regularly-reflected light. The first density pattern 801 includes four tone patterns (e.g., 70%, 50%, 30%, and 10%). The CPU 301 detects the first density pattern 801 formed on the intermediate transfer belt 7 with the toner pattern sensor 70 and calculates a difference between the detection result and a tone target. The CPU 301 corrects image formation conditions (e.g., transfer voltage, a tone correction table) so that each density (tone) approaches the tone target.

FIG. 12A illustrates a detection result for the first density pattern 801. A high-density (e.g., 70%) density pattern absorbs a large amount of light, and the detection level is therefore low. On the other hand, a low-density (e.g., 10%) density pattern absorbs less light, and the detection level is therefore high.

Figure 11B:
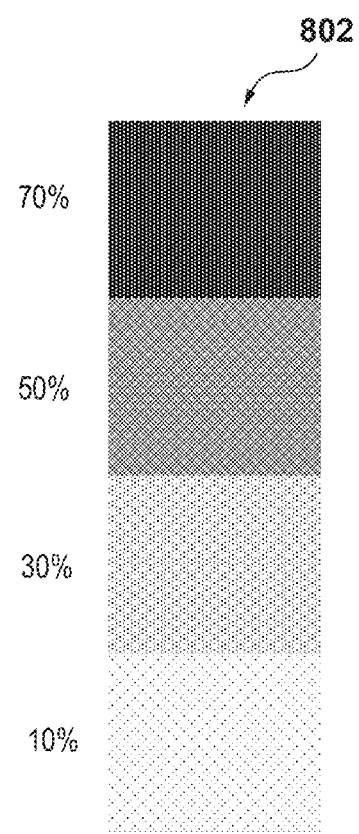

FIG. 11B illustrates a second density pattern 802 for detecting the density. The second density pattern 802 is a test pattern for turning off the LED 71, turning on the LED 72, and receiving the diffuse light with the PD 74. The second density pattern 802 is used to detect the density of chromatic colors such as yellow "Y", magenta "M", and cyan "C". Note that FIG. 11B illustrates the test pattern for one color.

The reflectance of yellow "Y", magenta "M", and cyan "C" is higher than the reflectance of the base material of the intermediate transfer belt 7. The density is therefore detected using the diffuse light.

The second density pattern 802 includes a test pattern of four tones (e.g., 70%, 50%, 30%, and 10%). The CPU 301 detects the second density pattern 802 formed on the intermediate transfer belt 7 with the toner pattern sensor 70 and calculates a difference between the detection result and a tone target. The CPU 301 corrects image formation conditions (e.g., transfer voltage, a tone correction table) so that each density (tone) approaches the tone target.

FIG. 12B illustrates a detection result for yellow "Y" detected by the second density pattern 802. A high-density (e.g., 70%) density pattern diffusely reflects a large amount of light, and the detection level of diffuse light is therefore high. A low-density (e.g., 10%) density pattern has a lower amount of diffusely reflected light (diffuse light), and the detection level is therefore low. The same density detection is executed for magenta "M" and cyan "C".

Other

A cable is attached to a connector of the toner pattern sensor, and it is necessary that an excessive force not be applied to the printed circuit board of the toner pattern sensor during the attachment process. Accordingly, the present embodiment proposes an image forming apparatus including a sensor that can be miniaturized and that is less likely to exert excessive force on the printed circuit board during the attachment process.

Distribution of Force Applied to Printed Circuit Board 101 in Attachment Process As illustrated in FIG. 4B, a force acting from the second surface 110b of the printed circuit board 101 towards the first surface 110a is produced in the process of attaching the cable 120 to the connector 105. Because the direction of this force pushes the printed circuit board 101 away from the frame member 108, the degree of close contact between the frame member 108 and the printed circuit board 101 can drop. If the printed circuit board 101 is not rigid enough, the printed circuit board 101 may bend or deform. As a result, the relationship between the attachment attitude of the light-emitting element and the attachment attitude of the light-receiving element, which constitute the optical sensor, may deviate from the relationship intended by design.

Figure 13A:
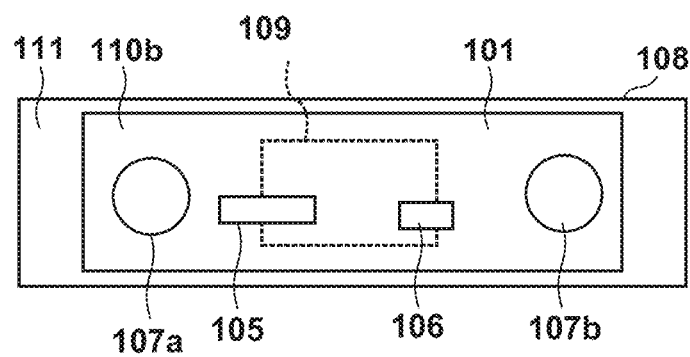
FIGS. 13A to 13C are diagrams illustrating a toner pattern sensor.
Figure 13B:
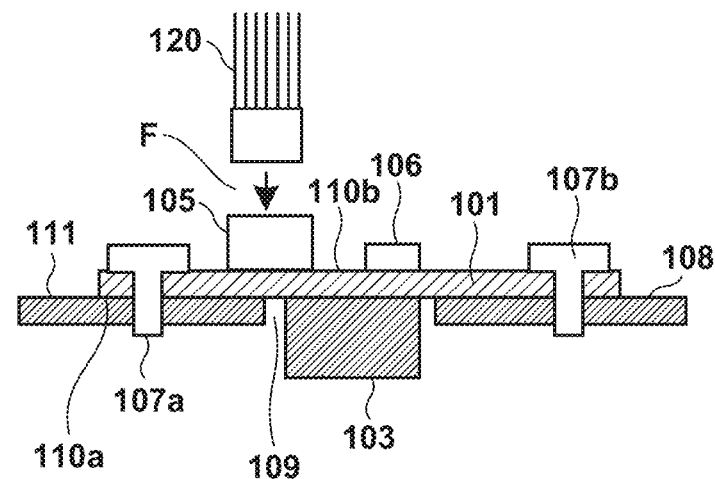
Figure 13C:
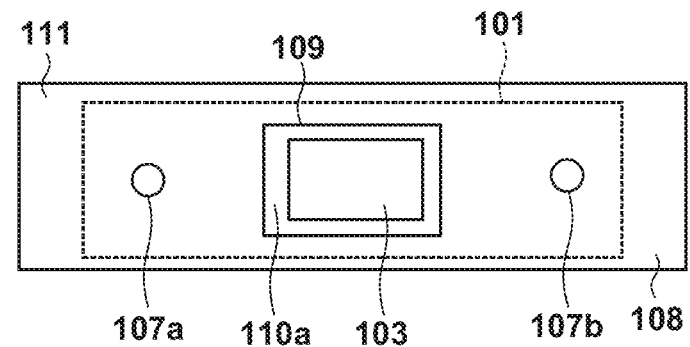

FIG. 13A is a plan view illustrating the second surface 110b of the printed circuit board 101 employing a force distribution measure for the printed circuit board 101. FIG. 13B is a cross-sectional view of the printed circuit board 101 employing the force distribution measure for the printed circuit board 101. FIG. 13C is a plan view illustrating the first surface 110a of the printed circuit board 101 employing the force distribution measure for the printed circuit board 101. In particular, the printed circuit board 101 is attached to the frame member 108 so that the first surface 110a of the printed circuit board 101 faces and is in close contact with an attachment surface of the frame member 108. Additionally, the optical case 103 is accommodated in and inserted into the through-hole 109 in the frame member 108. In other words, the opening area of the through-hole 109 may be made greater than the horizontal cross-sectional area of the optical case 103. The screws 107a and 107b are inserted into the screw holes 102a and 102b, respectively, in the direction from the first surface 110a toward the second surface 110b, and are screwed into the frame member 108.

The cable 120 is inserted into the connector 105 in the direction from the second surface 110b to the first surface 110a. This is a direction that brings the printed circuit board 101 closer to, and presses the printed circuit board 101 against, the frame member 108. The possibility of the printed circuit board 101 bending or deforming is therefore low.

Furthermore, as illustrated by the example in FIG. 13A, if the direction from the second surface 110b to the first surface 110a is taken as a line of sight, an attachment region of the connector 105 does not partially overlap with the through-hole 109. In other words, at least a part of the attachment region for the connector 105 is supported by the frame member 108 via the printed circuit board 101. This further reduces the possibility of the printed circuit board 101 bending or deforming. This reduces the probability that the printed circuit board 101 itself, or the components mounted to the printed circuit board 101, will be damaged during the attachment process. In this manner, problems caused by the attachment process become easier to address as the area of overlap between the attachment surface 111 of the frame member 108 and the attachment region of the connector 105 increases.

As illustrated in FIG. 13C, the through-hole 109 is covered by the printed circuit board 101. This makes it difficult for foreign objects to enter through the through-hole 109.

Technical Spirit Derived from Embodiments

[Aspect 1]

An intermediate transfer belt 7 is an example of an image carrier. The image forming units Pa to Pd are an example of an image forming unit configured to form an image on the image carrier. The outer roller 9 is an example of a transfer unit configured to transfer the image from the image carrier into a sheet. The toner pattern sensor 70 is an example of an optical sensor configured to measure reflected light from the image on the image carrier. The toner pattern sensor 70 may include a printed circuit board having a first mounting surface and a second mounting surface, a light-emitting element mounted on the first mounting surface of the printed circuit board, a light-receiving element mounted on the first mounting surface of the printed circuit board, and an electronic component mounted on the second mounting surface of the printed circuit board, wherein the electronic component is used for driving the light-emitting element. The printed circuit board 101 is an example of a printed circuit board having a first mounting surface (e.g., the first surface 110a) and a second mounting surface (e.g., the second surface 110b). The LEDs 71 and 72 and the PDs 73 and 74 protected by the optical case 103 are examples of an optical sensor mounted on the first mounting surface of the printed circuit board. The connector 105 is an example of an electronic component mounted on the second mounting surface of the printed circuit board. The frame member 108 is an example of a supporting member to which the printed circuit board is attached. The frame member 108 is an example of a supporting member configured to support the printed circuit board, the supporting member having a through-hole in which the electronic component on the second mounting surface is inserted when the printed circuit board is supported by the supporting member. The control unit 50 is an example of a controller configured to control the image forming unit based on a measurement result of the optical sensor. The frame member 108 has the attachment surface 111 facing the second mounting surface and the through-hole 109 in which the electronic component can be accommodated or inserted. The screws 107a and 107b are an example of a holding member that holds the printed circuit board with respect to the supporting member. The screws 107a and 107b may be fasteners such as screws or bolts and nuts. The holding member may be an adhesive member having an adhesive layer on both surfaces. The holding member may be an adhesive. According to this embodiment, the optical sensor is mounted on the first mounting surface and the electronic component is mounted on the second mounting surface. In other words, components are mounted on both surfaces of the printed circuit board, and the printed circuit board and the optical sensor can therefore be made smaller. Furthermore, the second mounting surface, to which the electronic component is attached, is attached to the attachment surface of the supporting member, and the electronic component is accommodated or inserted in the through-hole. Interference between the electronic component and the supporting member is therefore less likely to occur.

[Aspect 2]

As illustrated in FIG. 4B, the second mounting surface of the printed circuit board and the attachment surface of the supporting member may be in direct contact. This makes it possible for the printed circuit board to be stably supported by the supporting member. A metal or resin spacer, a sheet-shaped buffer member, or the like may be inserted between the second mounting surface of the printed circuit board and the attachment surface of the supporting member. In this manner, the second mounting surface of the printed circuit board and the attachment surface of the supporting member may be in indirect contact. The printed circuit board is stably supported by the supporting member in such a case as well.

[Aspect 3]

The electronic component may include the connector 105. A direction in which the cable 120 is inserted into and removed from the connector 105 is orthogonal to the second mounting surface. This makes it easier to insert and remove the cable 120 to and from the connector 105. The connector 105 is an example of a connector that is mounted on the second mounting surface of the printed circuit board, wherein the connector connects a cable for controlling the light-emitting element.

[Aspects 4-6]

As illustrated in FIG. 4C and the like, an opening area of the through-hole is greater than an area of a cross section (a horizontal cross-section) of the electronic component that is parallel to the printed circuit board. The opening area of the through-hole is smaller than an area of the second mounting surface of the printed circuit board. In other words, a length of the through-hole in a longer direction of the printed circuit board is shorter than a length of the printed circuit board in the longer direction of the printed circuit board, and a length of the through-hole in a shorter direction of the printed circuit board is shorter than a length of the printed circuit board in the shorter direction of the printed circuit board. Accordingly, the first mounting surface of the printed circuit board is fixed to the supporting member in such a manner that the through-hole is covered by a part of the first mounting surface of the printed circuit board. This makes it difficult for foreign objects and the like to pass through the through-hole and prevents foreign objects from entering through the through-hole.

[Aspects 7 and 8]

As illustrated in FIG. 5A, a length of the through-hole in a longer direction may be shorter than a length of the printed circuit board in a longer direction of the printed circuit board, and a length of the through-hole in a shorter direction may be longer than a length of the printed circuit board in a shorter direction of the printed circuit board. Alternatively, as illustrated in FIG. 5B, a length of the through-hole in the longer direction may be longer than a length of the printed circuit board in the longer direction, and a length of the through-hole in a shorter direction may be shorter than a length of the printed circuit board in the shorter direction.

[Aspect 9]

The holding member may include a screw. As illustrated in FIG. 5B and the like, the screws 107a and 107b are inserted into the printed circuit board from the second mounting surface toward the first mounting surface of the printed circuit board. The screws 107a and 107b are furthermore screwed into the supporting member. This ensures that the printed circuit board is securely fixed to the supporting member.

[Aspect 10]

As illustrated in FIG. 7, the optical sensor may include a first light-emitting element (e.g., the LED 71) mounted on the first mounting surface of the printed circuit board. The optical sensor may include a first light-receiving element (e.g., the PD 73) mounted on the first mounting surface of the printed circuit board. The optical sensor may include the optical case 103 that is mounted on the first mounting surface of the printed circuit board so as to cover the first light-emitting element and the first light-receiving element.

[Aspect 11]

The intermediate transfer belt 7 is an example of an image carrier that carries a toner image. As illustrated in FIG. 7, the first light-emitting element may be mounted on the first mounting surface in such a manner that light output from the first light-emitting element is incident on the image carrier at a predetermined incident angle. The first light-receiving element may be mounted on the first mounting surface in such a manner that regularly-reflected light from the image carrier or the toner image is incident on the first light-receiving element.

[Aspects 12 and 13]

As illustrated in FIG. 7, the optical sensor may include a second light-emitting element (e.g., the LED 72) mounted on the first mounting surface of the printed circuit board. The optical sensor may include a second light-receiving element (e.g., the PD 74) mounted on the first mounting surface of the printed circuit board. The optical case 103 may be mounted on the first mounting surface of the printed circuit board so as to cover the second light-emitting element and the second light-receiving element. As illustrated in FIG. 7, the second light-emitting element may be mounted on the first mounting surface in such a manner that light output from the second light-emitting element is incident on the image carrier at a predetermined incident angle. The second light-receiving element may be mounted on the first mounting surface in such a manner that diffuse light from the image carrier or the toner image is incident on the second light-receiving element.

[Aspect 14]

The image forming units Pa to Pd are an example of an image forming unit that forms a test pattern on the image carrier using toner. The CPU 301 is an example of a correction unit that corrects a writing timing of a toner image or an image density (tone properties) of the toner image in the image forming unit on the basis of a result of the optical sensor measuring the test pattern. According to this embodiment, the optical sensor is supported in a stable manner, which is thought to increase the measurement accuracy of the optical sensor. It is therefore thought that the accuracy of color shift correction and image density correction will be improved.

[Aspect 15]

The printed circuit board 101 is an example of a printed circuit board having a first mounting surface (e.g., the first surface 110a) and a second mounting surface (e.g., the second surface 110b). The LEDs 71 and 72 and the PDs 73 and 74 protected by the optical case 103 are examples of an optical sensor mounted on the first mounting surface of the printed circuit board. The connector 105 is an example of a connector mounted on the second mounting surface of the printed circuit board. As illustrated in FIG. 13B, a force acts on the connector 105 in a direction from the second mounting surface to the first mounting surface when the cable 120 is attached to the connector 105. The frame member 108 is an example of a supporting member to which the printed circuit board is attached. The frame member 108 has the attachment surface 111 facing the first mounting surface and the through-hole 109 in which the optical sensor can be accommodated or inserted. The screws 107a and 107b are an example of a holding member that holds the printed circuit board with respect to the supporting member. The screws 107a and 107b may be fasteners such as screws or bolts and nuts. The holding member may be an adhesive member having an adhesive layer on both surfaces. The holding member may be an adhesive. According to this embodiment, the optical sensor is mounted on the first mounting surface and the connector is mounted on the second mounting surface. In other words, components are mounted on both surfaces of the printed circuit board, and the printed circuit board and the optical sensor can therefore be made smaller. Furthermore, the first mounting surface, to which the optical sensor is attached, is attached to the attachment surface of the supporting member. As such, the force produced when attaching the cable to the connector acts in a direction that pushes the printed circuit board against the supporting member. This provides a toner pattern sensor in which an excessive force is less likely to act on the printed circuit board during the attachment process.

[Aspect 16]

As illustrated in FIG. 13B, the first mounting surface of the printed circuit board and the attachment surface of the supporting member may be in direct contact. This makes it possible for the printed circuit board to be stably supported by the supporting member. A metal or resin spacer, a sheet-shaped buffer member, or the like may be inserted between the first mounting surface of the printed circuit board and the attachment surface of the supporting member. In this manner, the first mounting surface of the printed circuit board and the attachment surface of the supporting member may be in indirect contact. The printed circuit board is stably supported by the supporting member in such a case as well.

[Aspects 17 and 18]

As indicated by the arrow F, in a direction from the second mounting surface toward the first mounting surface, an attachment region of the connector and the through-hole do not overlap or at least partially do not overlap. In other words, in a direction from the second mounting surface toward the first mounting surface, an attachment region of the connector and the attachment surface of the supporting member overlap or at least partially overlap. Through this, the connector is supported by the supporting member with the printed circuit board interposed therebetween, which reduces or suppresses bending and deformation of the printed circuit board during the attachment process.

[Aspects 19 and 20]

As indicated by the arrow F, a direction in which the cable is inserted into the connector is orthogonal to the first mounting surface of the printed circuit board. The direction in which the cable is inserted into the connector is orthogonal to the attachment surface of the supporting member. In such a case, the printed circuit board is likely to be subjected to high stress during the process of attaching the cable. Therefore, an arrangement or structure that has the first mounting surface facing the attachment surface of the supporting member increases the resilience to such stress.

[Aspects 21 and 22]

As illustrated in FIG. 5C and the like, an opening area of the through-hole is greater than an area of a cross section (a horizontal cross-section) of the optical sensor that is parallel to the printed circuit board. The opening area of the through-hole is smaller than an area of the first mounting surface of the printed circuit board. In other words, the first mounting surface of the printed circuit board is fixed to the supporting member in such a manner that the through-hole is covered by a part of the first mounting surface of the printed circuit board. This makes it difficult for foreign objects and the like to pass through the through-hole and prevents foreign objects from entering through the through-hole.

[Aspect 23]

The holding member may include a screw. As illustrated in FIG. 13B and the like, the screws 107a and 107b are inserted into the printed circuit board from the second mounting surface toward the first mounting surface of the printed circuit board. The screws 107a and 107b are furthermore screwed into the supporting member. This ensures that the printed circuit board is securely fixed to the supporting member.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-070564, filed Apr. 9, 2020 and Japanese Patent Application No. 2020-070565, filed Apr. 9, 2020 which are hereby incorporated by reference herein in their entirety.

What is claimed is:

1. An image forming apparatus comprising:
   an image carrier;
   an image forming unit configured to form an image on the image carrier;
   a transfer unit configured to transfer the image from the image carrier onto a sheet;
   an optical sensor configured to measure reflected light from a test image on the image carrier, the test image being formed by the image forming unit, the optical sensor including:
      a printed circuit board;
      a light-emitting element provided on a first surface of the printed circuit board, the light-emitting element being configured to irradiate the test image on the image carrier with light;
      a light-receiving element provided on the first surface of the printed circuit board, the light-receiving element being configured to receive the reflected light from the test image on the image carrier; and
      a connector provided on a second surface of the printed circuit board opposite to the first surface of the printed circuit board, with a cable for controlling the optical sensor being connected to the connector;
   a support member configured to support the optical sensor so that the first surface of the printed circuit board faces a surface of the image carrier; and
   a controller configured to control the image forming unit based on a result of the reflected light from the test image measured by the optical sensor,
   wherein a direction in which the cable is inserted into the connector is orthogonal to the second surface of the printed circuit board,
   wherein the printed circuit board is screwed to the support member by a first screw and a second screw, and
   wherein the connector is positioned between a position of the first screw and a position of the second screw in a longitudinal direction of the printed circuit board.

2. An image forming apparatus comprising:
an image carrier;
an image forming unit configured to form an image on the image carrier;
a transfer unit configured to transfer the image from the image carrier onto a sheet;
an optical sensor configured to measure reflected light from a test image on the image carrier, the test image being formed by the image forming unit, the optical sensor including:
 a printed circuit board;
 a light-emitting element provided on a first surface of the printed circuit board, the light-emitting element being configured to irradiate the test image on the image carrier with light;
 a light-receiving element provided on the first surface of the printed circuit board, the light-receiving element being configured to receive the reflected light from the test image on the image carrier; and
 a connector provided on a second surface of the printed circuit board opposite to the first surface of the printed circuit board, with a cable for controlling the optical sensor being connected to the connector;
a support member configured to support the optical sensor so that the first surface of the printed circuit board faces a surface of the image carrier; and
a controller configured to control the image forming unit based on a result of the reflected light from the test image measured by the optical sensor,
wherein a direction in which the cable is inserted into the connector is orthogonal to the second surface of the printed circuit board,
wherein the printed circuit board is screwed to the support member by a first screw and a second screw, and
wherein the light-emitting element and the light-receiving element are positioned between a position of the first screw and a position of the second screw in a longitudinal direction of the printed circuit board.

3. An image forming apparatus comprising:
an image carrier;
an image forming unit configured to form an image on the image carrier;
a transfer unit configured to transfer the image from the image carrier onto a sheet;
an optical sensor configured to measure reflected light from a test image on the image carrier, the test image being formed by the image forming unit, the optical sensor including:
 a printed circuit board;
 a light-emitting element provided on a first surface of the printed circuit board, the light-emitting element being configured to irradiate the test image on the image carrier with light;
 a light-receiving element provided on the first surface of the printed circuit board, the light-receiving element being configured to receive the reflected light from the test image on the image carrier; and
 another light-emitting element provided on the first surface of the printed circuit board;
 another light-receiving element provided on the first surface of the printed circuit board,
 a connector provided on a second surface of the printed circuit board opposite to the first surface of the printed circuit board, with a cable for controlling the optical sensor being connected to the connector;
a support member configured to support the optical sensor so that the first surface of the printed circuit board faces a surface of the image carrier; and
a controller configured to control the image forming unit based on a result of the reflected light from the test image measured by the optical sensor,
wherein a direction in which the cable is inserted into the connector is orthogonal to the second surface of the printed circuit board,
wherein the light-emitting element, the light-receiving element, the another light-receiving element, and the another light-emitting element are arranged in a longitudinal direction of the printed circuit board, and
wherein the light-receiving element and the another light-receiving element are arranged between the light-emitting element and the another light-emitting element.

4. The image forming apparatus according to claim 3, wherein, in a case where the light-emitting element irradiates the test image with light, the light-receiving element receives regular reflected light from the test image,
 wherein, in a case where the another light-emitting element irradiates the test image with light, the light-receiving element receives diffuse reflected light from the test image, and
 wherein, in a case where the another light-emitting element irradiates the test image with light, the another light-receiving element receives diffuse reflected light from the test image.

* * * * *